(12) United States Patent
Han

(10) Patent No.: US 7,528,070 B2
(45) Date of Patent: May 5, 2009

(54) SPUTTERING APPARATUS AND METHOD FOR FORMING METAL SILICIDE LAYER USING THE SAME

(75) Inventor: Jae Won Han, Suwon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 481 days.

(21) Appl. No.: 11/319,227

(22) Filed: Dec. 28, 2005

(65) Prior Publication Data

US 2006/0141783 A1 Jun. 29, 2006

(30) Foreign Application Priority Data

Dec. 29, 2004 (KR) .................... 10-2004-0114857

(51) Int. Cl.
*H01L 21/44* (2006.01)

(52) U.S. Cl. .................. 438/682; 438/630; 438/649; 438/655

(58) Field of Classification Search .......... 438/630, 438/649, 655, 682, 683; 204/192.12, 192.15, 204/192.17
See application file for complete search history.

(56) References Cited

U.S. PATENT DOCUMENTS 6,036,821 A * 3/2000 Warren ................ 204/192.12
6,238,527 B1 * 5/2001 Sone et al. ............ 204/192.12
6,309,515 B1 * 10/2001 Inoue et al. ................ 438/649
7,291,360 B2 * 11/2007 Hanawa et al. ........... 427/248.1

FOREIGN PATENT DOCUMENTS

| KR | 1019970009828 | 6/1997 |
|---|---|---|
| KR | 100198621 | 3/1999 |
| KR | 1020000009238 | 2/2000 |

* cited by examiner

*Primary Examiner*—Kevin M Picardat
(74) *Attorney, Agent, or Firm*—McKenna Long & Aldridge LLP

(57) ABSTRACT

A sputtering apparatus for forming a low-resistance uniform metal silicide layer without additional heat treatment and a metal silicide layer forming method using the same are provided. The sputtering apparatus includes a sputtering chamber; a gas introduction port formed at an upper location of a lateral wall of the sputtering chamber; a gas exhaust port formed at a bottom wall of the sputtering chamber; a target located in an upper region of the sputtering chamber; a power source to supply the target with high-frequency electric power; a stage located in a bottom region of the sputtering chamber to heat the semiconductor substrate; and a sieve provided between the target and the semiconductor substrate to improve straightness of charged metal particles.

15 Claims, 6 Drawing Sheets

SPUTTERING APPARATUS AND METHOD FOR FORMING METAL SILICIDE LAYER USING THE SAME

CROSS-REFERENCE TO RELATED APPLICATION

This application claims the benefit of Korean Patent Application No. 10-2004-0114857, filed on Dec. 29, 2004, which is hereby incorporated by reference as if fully set forth herein.

BACKGROUND OF THE INVENTION

1. Field of the Invention

The present invention relates to a method for manufacturing a semiconductor device, and more particularly, to a sputtering apparatus for forming a low-resistance uniform metal silicide layer that does not require a post heat treatment and a metal silicide layer forming method using the same.

2. Discussion of the Related Art

With the reduction in the geometrical size of semiconductor devices, the areas of gate and source/drain regions are decreasing. Along with this reduction in size, there is a need to reduce the bonding thickness of source/drain regions and the resulting high-resistance regions. To substantially lower the resistance in the source/drain regions at adjacent polysilicon regions, metal silicides are used for the electrical contacts between those regions. Such silicides, which may be of platinum, manganese, cobalt, or titanium, are formed wherever the source/drain regions are to come into contact with exposed polysilicon regions. The silicides are formed by depositing and then heating a thin metal layer having a high fusion point. Such a method for forming a metal silicide layer according to a related art is shown in FIGS. 1A-1D.

Referring to FIG. 1A, a semiconductor substrate 21 is divided into an active region and a device separating region. A device isolation layer 22 is formed on the semiconductor substrate 21 at the device separating region. Next, a gate electrode 24 is formed on the semiconductor substrate 21 at the active region via a conventional process after forming a gate oxide layer 23 on the semiconductor substrate 21. Subsequently, a lightly doped drain (LDD) region 25 is formed on a surface of the semiconductor substrate 21 at either lateral side of the gate electrode 24, an insulation sidewall 26 is formed at either lateral surface of the gate electrode 24, and a source/drain impurity region 27 is formed on the surface of the semiconductor substrate 21 at either lateral side of both the gate electrode 24 and the insulation sidewall 26, in this order, to achieve a transistor.

The semiconductor substrate 21 is then subjected to a washing process for removing various objects, such as metal impurities, organic pollutants, natural oxides, etc. Conventionally, the washing process is a chemical washing process using a standard cleaning 1 (SC1) solution and hydrofluoric (HF) or dilute hydrofluoric (DHF) solution. Here, the SC1 solution can be an organic matter having a mixing ratio of $NH_4OH:H_2O_2:H_2O$ of 1:4:20.

Referring to FIG. 1B, a metal layer 28, for the formation of silicide, such as a cobalt layer, is formed on the surface of the semiconductor substrate 21 via a sputtering process, which is performed in a sputtering chamber of a sputtering apparatus.

Referring to FIG. 1C, the semiconductor substrate 21 is heat treated at a temperature of 400° C. to 600° C. in a particular apparatus, for example, a rapid thermal process apparatus or an electric furnace. As a result, a metal silicide layer 29 is formed on the semiconductor substrate 21 at positions corresponding to the gate electrode 24 and the source/drain impurity region 27. The metal silicide layer 29 is obtained as metal ions of the metal layer 28 react with silicon ions of the semiconductor substrate 21 and gate electrode 24 during the heat treatment. The metal layer 28 remains on the insulation sidewall 26 and device isolation layer 22 without reaction.

Referring to FIG. 1D, after removing the remained metal layer 28, which is not used to form the metal silicide film 29, the semiconductor substrate 21 is subjected to an annealing process at a predetermined temperature. This annealing process stabilizes the phase of the metal silicide layer 29, achieving the low-resistance metal silicide layer 29.

According to the method for forming a metal silicide layer as described above, however, the additional heat treatment step for forming the metal silicide layer requires transferring the semiconductor substrate with the deposited metal layer to the particular heating apparatus. Due to this additional heat treatment, the overall forming method is complex, requires an additional apparatus, and increases the cycling time of the lot in progress.

SUMMARY OF THE INVENTION

Accordingly, the present invention is directed to a sputtering apparatus and a metal silicide layer forming method using the same that substantially obviate one or more problems due to limitations and disadvantages of the related art.

One advantage of the present invention is that it provides a sputtering apparatus for forming a low-resistance uniform metal silicide layer without any additional heat treatment and a metal silicide layer forming method using the same.

Additional advantages and features of the invention will be set forth in part in the description which follows and in part will become apparent to those having ordinary skill in the art upon examination of the following. The objectives and other advantages of the invention may be realized and attained by the stricture particularly pointed out in the written description and claims hereof as well as the appended drawings.

To achieve these and other advantages in accordance with the invention, as embodied and broadly described herein, there is provided a sputtering apparatus comprising a sputtering chamber; a gas introduction port formed at an upper location of a lateral wall of the sputtering chamber; a gas exhaust port formed at a bottom wall of the sputtering chamber; a target located in an upper region of the sputtering chamber, the target being made of a material that will make up a layer to be deposited; a power source to supply the target with high-frequency electric power; a stage located in a bottom region of the sputtering chamber, upon which a semiconductor substrate is placed, the stage being used to heat the semiconductor substrate; a sieve provided between the target and the semiconductor substrate to improve straightness of the path or alignment of charged metal particles; and a supporting member protruding from an inner wall surface of the sputtering chamber to support the sieve.

In another aspect of the present invention, there is provided a method for forming a metal silicide layer by using of the sputtering apparatus described above. The method comprises supplying a process gas into the sputtering chamber via the gas introduction port; supplying high-frequency electric power to the target located in the upper region of the sputtering chamber; producing plasma between the target and the sieve, and dispersing the charged metal particles via the plasma which strikes the target; and reacting the charged metal particles, having passed through the sieve, with the semiconductor substrate after heating the substrate, to form the metal silicide layer on the semiconductor substrate.

In another aspect of the present invention, there is provided a method for forming a metal silicide layer. The method comprises forming a transistor, which includes a gate electrode and a source/drain region, on a semiconductor substrate; loading the semiconductor substrate formed with the transistor into a sputtering apparatus in which a sieve having a plurality of holes is provided between a target and a stage; dispersing charged metal particles by striking the target of the sputtering apparatus; and depositing a metal layer on the semiconductor substrate after heating the semiconductor substrate, and simultaneously, reacting the charged metal particles with the semiconductor substrate formed with the gate electrode and the source/drain region, to form the metal silicide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference designations will be used throughout the drawings to refer to the same or similar parts.

Figure 1A:
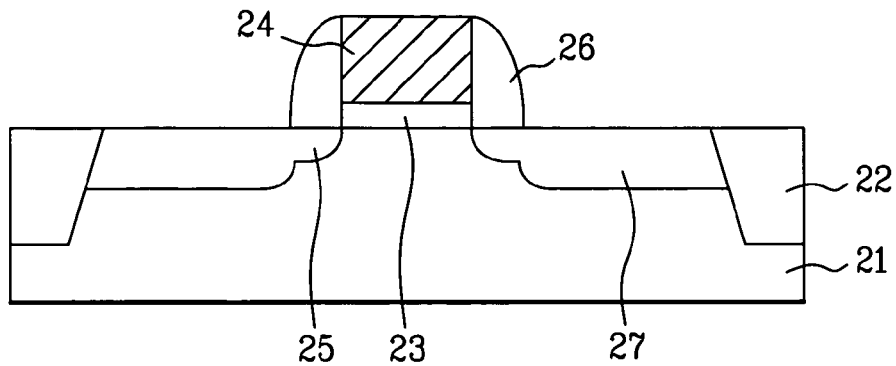
FIGS. 1A-1D are sectional views illustrating a metal silicide layer forming method according to the prior art.
Figure 1B:
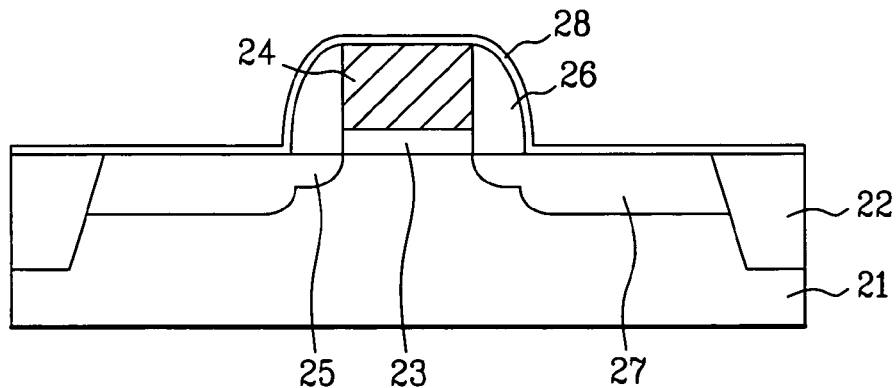
Figure 1C:
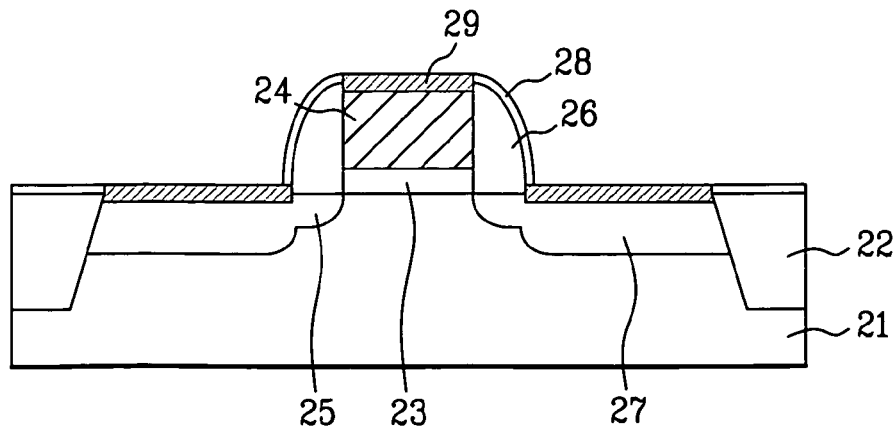
Figure 1D:
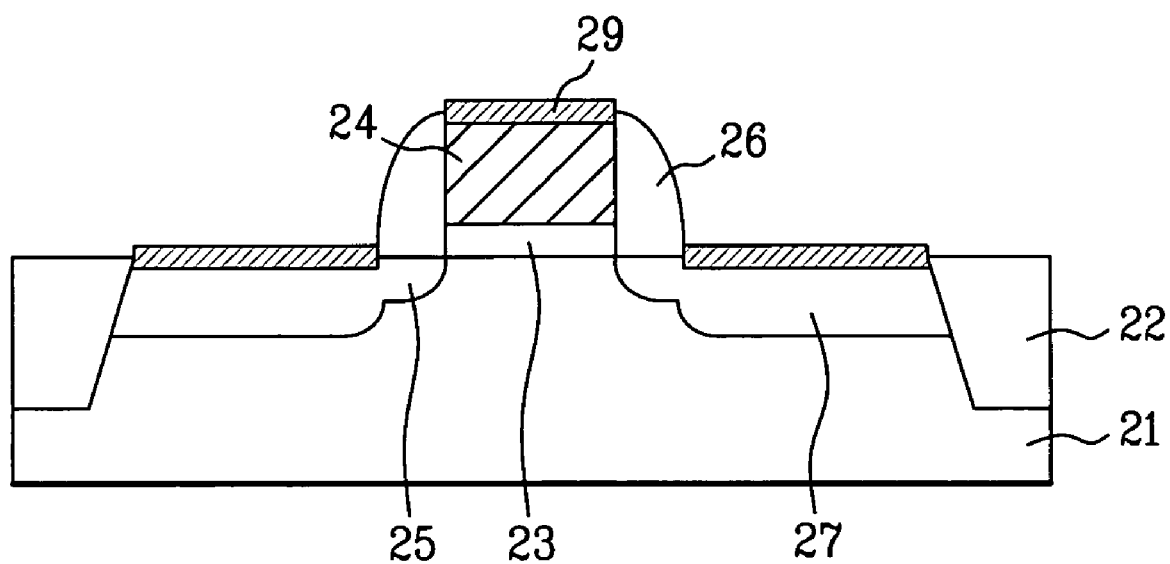
Figure 2:
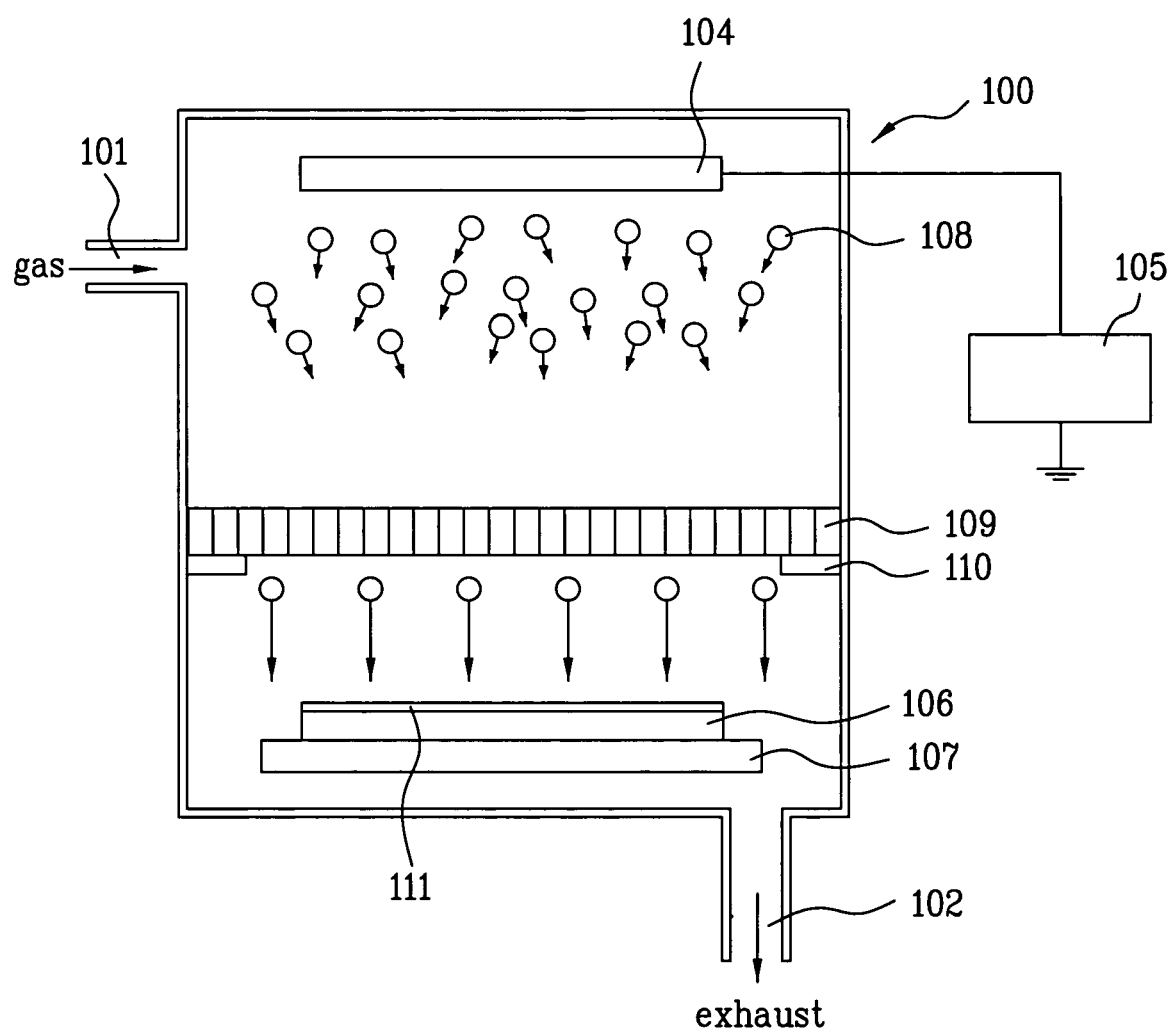
FIG. 2 is a schematic configuration diagram illustrating a sputtering apparatus according to the present invention.

Referring to FIG. 2, a sputtering apparatus according to the present invention includes a sputtering chamber 100. A gas introduction port 101 is formed at an upper location of a lateral wall of the sputtering chamber 100, and a gas exhaust port 102 is formed at a bottom wall of the sputtering chamber 100.

A target 104, which is made of a material that will make up a layer to be deposited, is located in an upper region of the sputtering chamber 100. High-frequency electric power from an external high-frequency power source 105 is applied to the target 104.

A stage 107 is mounted close to the bottom wall of the sputtering chamber 100 and a semiconductor substrate 106 is placed on the stage 107. A sieve 109 is mounted between the target 104 and the semiconductor substrate 106 to improve straightness of charged metal particles 108. The sieve 109 is located on a supporting member 110, which protrudes perpendicular from an inner wall surface of the chamber 100 to support the sieve 109.

In an exemplary embodiment, the size of the sieve 109 generally corresponds to that of the target 104.

The stage 107 is internally provided with a radiating plate (not shown) to heat the semiconductor substrate 106 to a temperature of 450° C. to 600° C. when the charged metal particles 108 are deposited onto the semiconductor substrate 106.

Figure 3A:
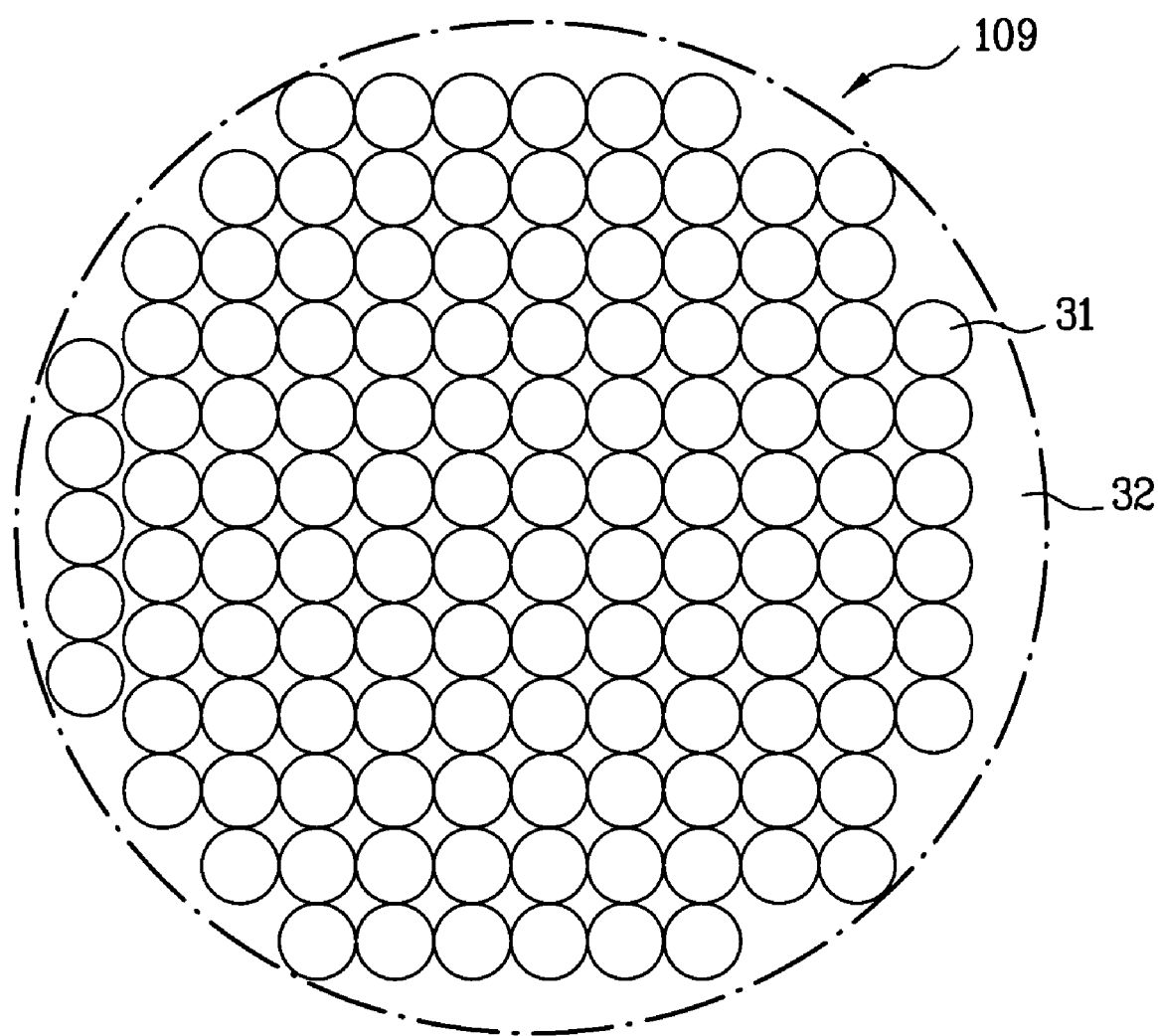
FIGS. 3A and 3B are plan views illustrating the structure of a sieve shown in FIG. 2.
Figure 3B:
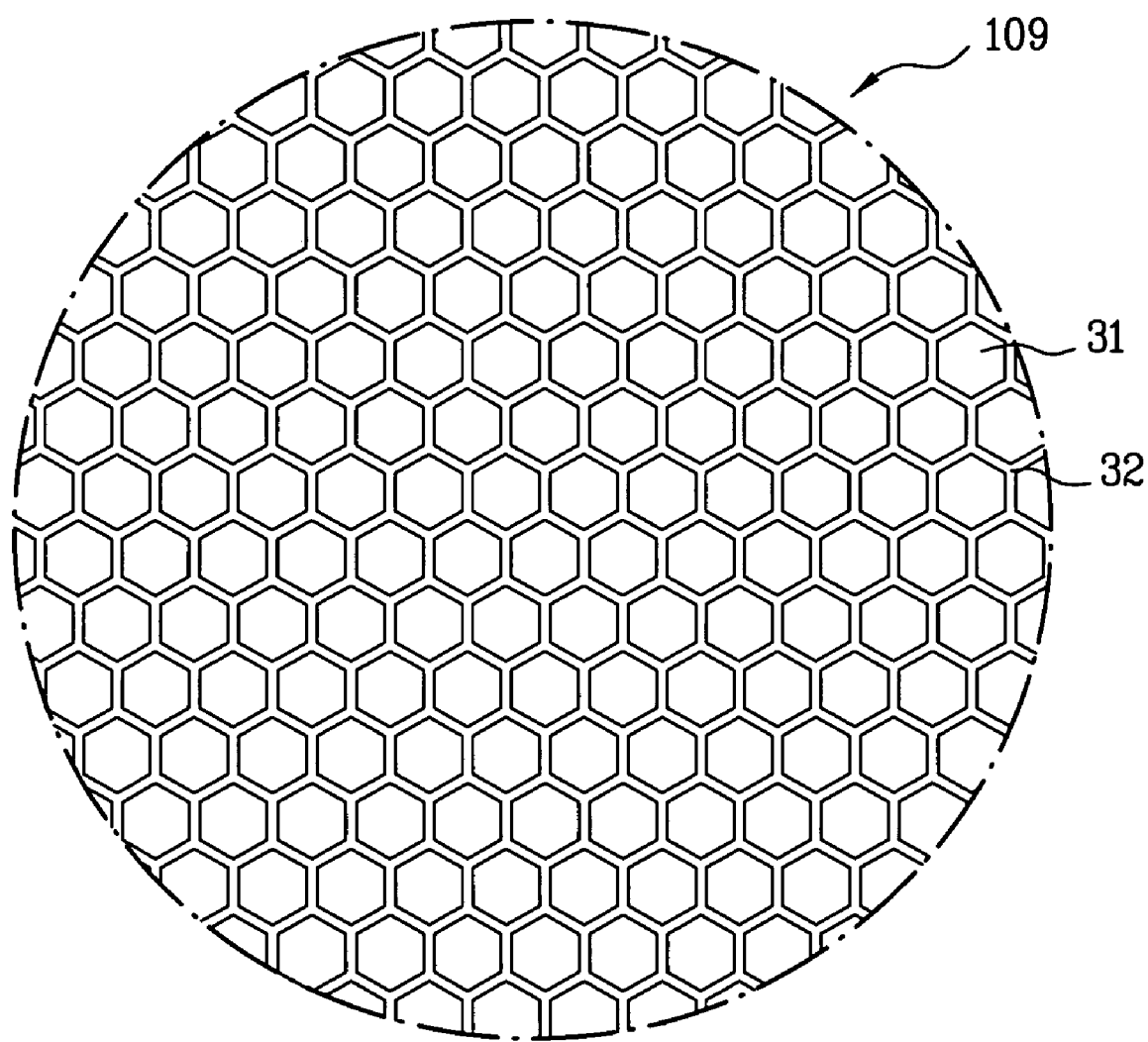

FIGS. 3A and 3B are plan views illustrating the structure of the sieve 109 as shown in FIG. 2. The sieve 109 is formed of a metal plate 32, which is perforated with a plurality of holes 31 having a circular shape (FIG. 3A) or hexagonal shape (FIG. 3B). For example, the sieve 109 has a honeycombed circular shape with the holes 31 to pass the charged metal particles 108 therethrough.

The shape of the holes 31 is not limited to circular or hexagonal shapes, and may be formed into various shapes, such as rectangular, triangular, pentagonal shape or polygonal shape.

The metal plate 32 can be made of cobalt, aluminum, titanium or alloys thereof.

The sieve 109 can have a thickness of approximately 3 mm to 5 mm, and each hole 31 can have an area of approximately 1 cm$^2$ to 10 cm$^2$.

A metal silicide layer forming method using the sputtering apparatus of the present invention is described below.

First, a process gas is supplied into the sputtering chamber 100 through the gas introduction port 101, and high-frequency electric power from the high-frequency power source 105 is applied to the target 104.

Plasma is produced between the target 104 and the sieve 109, so that positive ions of the process gas produced by the plasma strikes the target 104. With such a strike, the dispersed charged metal particles 108 are propelled at a faster speed toward the stage 107 that serves as a cathode. As such, the charged metal particles 108 are deposited on the semiconductor substrate 106.

The sieve 109 serves to provide the charged metal particles 108 with straightness and alignment to result in uniformity for the deposited layer.

When the charged metal particles 108 are deposited onto the semiconductor substrate 106, the stage 107, upon which the semiconductor substrate 106 is placed, is heated to a temperature of 450° C. to 600° C. This results in a uniform metal silicide layer 111 being formed on the semiconductor substrate 106 via a reaction between the charged metal particles 108 and the semiconductor substrate 106.

The metal silicide layer 111 can be made of a metal having a high fusion point, such as cobalt, titanium, tungsten, tantalum, and molybdenum.

If the temperature of the semiconductor substrate 106 is excessively increased by overheating the stage 107, the silicon surface of the semiconductor substrate 106 produces a barrier layer that hinders silicidation. For example, when the charged metal particles 108 are cobalt particles, a barrier layer to prevent formation of cobalt silicide may be formed on the silicon surface.

To solve this issue in an exemplary embodiment, a high DC power of 2 to 10 kW and a low gas pressure are applied to the cobalt particles during a sputtering process to increase kinetic energy of the sputtered cobalt particles.

Moreover, argon gas can be used as the process gas and is introduced through the gas introduction port 101 with a flow rate of 40 sccm to 70 sccm. If heated argon gas is used, a flow rate of 8 to 15 sccm can be sufficient.

Figure 4A:
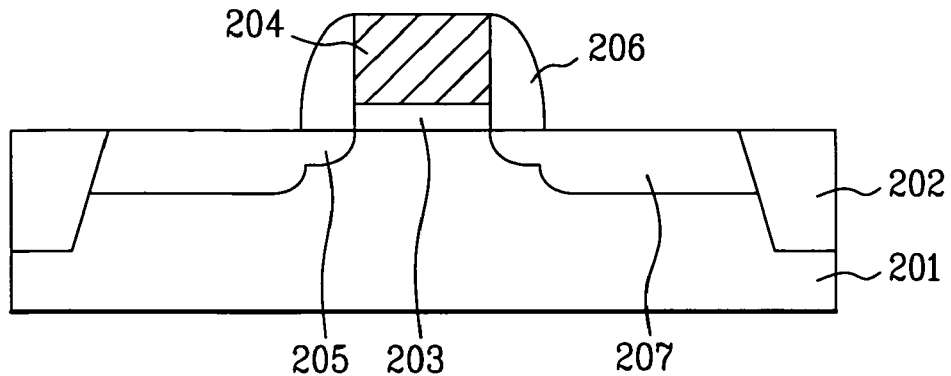
FIGS. 4A-4C are sectional views illustrating a metal silicide layer forming method according to the present invention.
Figure 4B:
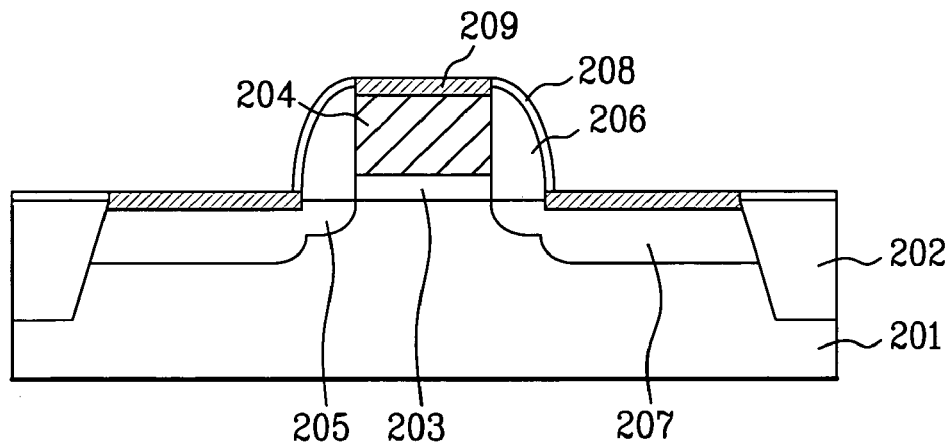
Figure 4C:
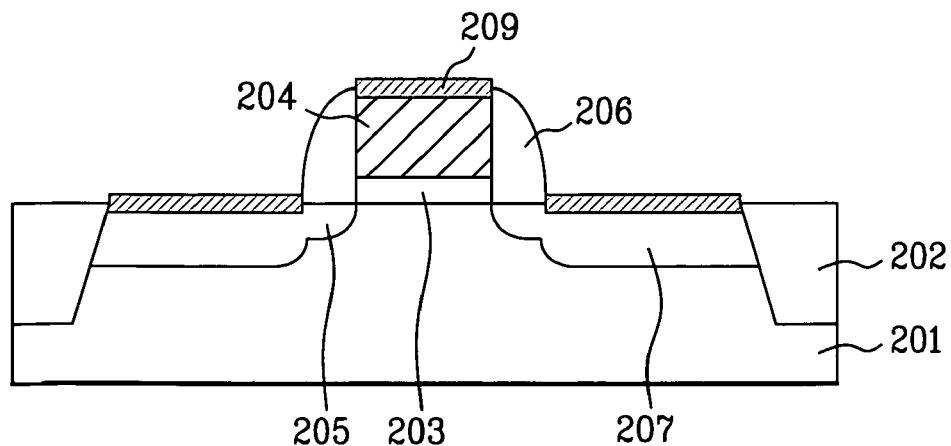

FIGS. 4A-4C illustrate a metal silicide layer forming method according to one embodiment the present invention.

Referring to FIG. 4A, a semiconductor substrate 201 can be divided into an active region and a device separating region. A device isolation layer 202 having a local oxidation of silicon (LOCOS) or shallow trench isolation (STI) structure can be formed on the semiconductor substrate 201 at the device separating region.

Subsequently, a gate electrode 204 can be formed on the semiconductor substrate 201 at the active region via a conventional process, after forming a gate oxide layer 203 on the semiconductor substrate 201. A lightly doped drain (LDD) region 205 can be formed in a surface of the semiconductor substrate 201 at either lateral side of the gate electrode 204, an insulation sidewall 206 can be formed at either lateral surface of the gate electrode 204, and a source/drain impurity region 207 can be formed in the surface of the semiconductor substrate 201 at either lateral side of both the gate electrode 204 and the insulation sidewall 206 in this order, to achieve a transistor.

The semiconductor substrate 201 can be subjected to a washing process for removing various objects, such as metal impurities, organic pollutants, natural oxides, etc.

The washing process can be a chemical washing process using a standard cleaning 1 (SC1) solution and hydrofluoric (HF) or dilute hydrofluoric (DHF) solution. The SC1 solution can be an organic matter having a mixing ratio of $NH_4OH:H_2O_2:H_2O$ of 1:4:20.

Referring to FIG. 4B, the semiconductor substrate 201 can be loaded into the sputtering chamber 100 of the sputtering apparatus configured as shown in FIG. 2, wherein a metal layer 208 for the formation of silicide, such as a cobalt or titanium layer, can be deposited on the surface of the semiconductor substrate 201 via a sputtering process.

The semiconductor substrate 201 can be heated to a temperature of 450° C. to 600° C. using a heater block (not shown) or via a convection of argon gas. In the latter case, heated argon gas having a flow rate of 8 to 15 sccm may be used as gas for heating the substrate 201.

As noted above, if the metal layer 208 is deposited on the semiconductor substrate 201 via a sputtering process in which the semiconductor substrate 201 is excessively heated, the high-temperature semiconductor substrate 201 transmits heat energy to the sputtered metal particles such that a metal silicide layer 209 is formed at the silicon surface of the semiconductor substrate 201.

In these circumstances, the metal layer 208 that is deposited on the device isolation layer 202 or the insulation sidewall 206 is not silicided even if heat energy is applied thereto. Instead, self-aligned salicide is produced at the same time as the deposition of the metal layer 208.

As stated above, if the temperature of the semiconductor substrate 201 is excessively high, a barrier layer, which hinders the formation of the metal silicide layer 209, may be formed on the silicon surface of the semiconductor substrate 201. This can consequently result in ineffective silicidation.

To eliminate or reduce this problem, a high power, for example, a high DC power of 2 to 10 kW, can be applied during sputtering of the metal layer 208. Furthermore, a low-pressure process gas, for example, argon gas having a flow rate of 40 to 70 sccm, can be used in the formation of the metal layer 208.

When the metal particles are sputtered using the high DC power, the particles can penetrate any barrier layer, thereby successfully forming the metal silicide layer 209.

The sieve 109 provided between the target 104 and the semiconductor substrate 106, as shown in FIG. 2, can provide a uniform metal silicide layer 209.

Referring to FIG. 4C, after removing the metal layer 208, which is not used to form the metal silicide layer 209, the semiconductor substrate 201 is subjected to an annealing process. The annealing process stabilizes the phase of the metal silicide layer 209 to achieve the low-resistance metal silicide layer 209.

The method of removing the metal layer 208 includes a primary removal process, which can use a sulfuric acid/hydrogen peroxide mixture (SPM) solution having a temperature of about 50 to 150° C. for a time of about 5 to 15 minutes, and a secondary removal process, which can use a standard cleaning 1 (SC1) solution having a temperature of about 40° C. to 70° C. for a time of about 3 to 10 minutes.

The annealing process can be performed by heating the semiconductor substrate 201 to a temperature of about 700° C. to 950° C. for a time of about 10 to 60 seconds in a rapid heat treatment apparatus, or by heating the semiconductor substrate 201 to a temperature of about 500° C. to 900° C. for a time of about 20 to 60 minutes in an electric furnace.

As apparent from the above description, the present invention provides a sputtering apparatus and a metal silicide layer forming method using the same having the following effect.

According to an embodiment of the present invention, the thickness of the metal silicide layer can be easily adjusted to achieve uniformity.

It will be apparent to those skilled in the art that various modifications can be made in the present invention without departing from the spirit or scope of the invention. Thus, it is intended that the present invention covers such modifications of this invention provided they come within the scope of the appended claims and their equivalents.

What is claimed is:

1. A method for forming a metal silicide layer, comprising:
   forming a transistor, which includes a gate electrode and a source/drain region, on a semiconductor substrate;
   loading the semiconductor substrate formed with the transistor into a sputtering apparatus having a sieve with a plurality of holes between a target and a stage;
   dispersing charged metal particles by striking the target of the sputtering apparatus; and
   forming the metal silicide layer by heating the semiconductor substrate to react the charged metal particles with the semiconductor substrate when the charged metal particles are deposited onto the semiconductor substrate.

2. The method as set forth in claim 1, further comprising:
   washing the semiconductor substrate prior to forming the metal silicide layer.

3. The method as set forth in claim 1, further comprising:
   removing any unreacted metal layer charged metal particles after forming the metal silicide layer.

4. The method as set forth in claim 1, further comprising:
   annealing the semiconductor substrate after forming the metal silicide layer.

5. A sputtering apparatus for forming a layer on a semiconductor device, comprising:
   a sputtering chamber with upper, bottom, and lateral walls;
   a gas introduction port formed at an upper portion of one of the lateral walls of the sputtering chamber;
   a gas exhaust port formed at the bottom wall of the sputtering chamber;
   a target of material that forms the layer to be deposited, said target located in an upper region of the sputtering chamber;
   a power source to supply the target with high-frequency electric power;
   a stage located in a bottom region of the sputtering chamber that supports and heats a semiconductor substrate, wherein the stage is internally provided with a radiating plate to heat the semiconductor substrate;

a sieve provided between the target and the semiconductor substrate to straighten charged metal particles from the target; and a supporting member arranged on an inner wall surface of the sputtering chamber to support the sieve.

6. The apparatus as set forth in claim 5, wherein the sieve includes a metal plate perforated with a plurality of holes to pass the charged metal particles therethrough.

7. The apparatus as set forth in claim 6, wherein each of the holes has a circular, rectangular, triangular, pentagonal, hexagonal, or polygonal shape.

8. The apparatus as set forth in claim 6, wherein the metal plate includes at least one of cobalt, aluminum, titanium and alloys thereof.

9. The apparatus as set forth in claim 6, wherein the metal plate has a thickness of about 3 mm to 5 mm.

10. The apparatus as set forth in claim 6, wherein the each hole has an area of about 1 $cm^2$ to 10 $cm^2$.

11. A processes for forming a metal silicide layer on the semiconductor substrate by use of the sputtering apparatus as set forth in claim 1, comprising:

supplying a process gas into the sputtering chamber via the gas introduction port;

supplying the high-frequency electric power to the target;

producing plasma between the target and the sieve, and dispersing the charged metal particles by use of the plasma which strikes the target, wherein the charged particles pass through the sieve; and heating the semiconductor substrate to react the charged metal particles with the semiconductor substrate when the charged metal particles are deposited onto the semiconductor substrate.

12. The process as set forth in claim 11, wherein the semiconductor substrate is heated to a temperature of 450° C. to 600° C.

13. The process as set forth in claim 11, wherein the high-frequency electric power is high DC power of 2-10 kW.

14. The process as set forth in claim 11, wherein the process gas is argon gas having an introduction flow rate of 40-70 sccm.

15. The process as set forth in claim 11, wherein the process gas is heated argon gas having an introduction flow rate of 8-15 sccm.

* * * * *